United States Patent [19]

Abraham et al.

[11] Patent Number: 5,260,577
[45] Date of Patent: Nov. 9, 1993

[54] SAMPLE CARRIAGE FOR SCANNING PROBE MICROSCOPE

[75] Inventors: David W. Abraham, Ossining, N.Y.; James M. Hammond, Boca Raton, Fla.; Martin A. Klos, Boca Raton, Fla.; Kenneth G. Roessler, Boca Raton, Fla.; Robert M. Stowell, Delray Beach, Fla.; Hemantha K. Wickramasinghe, Chappaqua, N.Y.

[73] Assignee: International Business Machines Corp., Armonk, N.Y.

[21] Appl. No.: 973,796

[22] Filed: Nov. 9, 1992

[51] Int. Cl.⁵ .................................. H01J 37/20
[52] U.S. Cl. ...................... 250/442.11; 250/306; 250/307
[58] Field of Search ............ 250/306, 307, 440.11, 250/441.11, 442.11, 443.11

[56] References Cited

U.S. PATENT DOCUMENTS

| | | | |
|---|---|---|---|
| 3,426,193 | 2/1969 | Guernet | 250/441.11 |
| 4,314,623 | 2/1982 | Kurokawa | 188/267 |
| 4,432,441 | 2/1984 | Kurokawa | 188/267 |
| 4,560,880 | 12/1985 | Petric et al. | 250/441.11 |
| 4,698,502 | 10/1987 | Bednorz et al. | 250/306 |
| 4,908,519 | 3/1990 | Park et al. | 250/306 |
| 4,935,634 | 6/1990 | Hansma et al. | 250/306 |
| 4,947,042 | 8/1990 | Nishioka et al. | 250/306 |
| 5,041,783 | 8/1991 | Ohta et al. | 250/306 |

OTHER PUBLICATIONS

IBM Technical Disclosure Bulletin, "Dynamic Vibration Isolation for Sensitive Apparatus", J. Gimzewski et al, Dec. 1986, vol. 29, No. 7, pp. 2935-2936.

*Primary Examiner*—Bruce C. Anderson
*Attorney, Agent, or Firm*—Romualdas Strimaitis

[57] ABSTRACT

A sample carriage, for receiving a sample to be scanned and positionable in a scanning probe microscope, is used for physically decoupling the sample from the scanning probe microscope assembly. The sample carriage, constructed from low thermal coefficient material, is physically decoupled by releasably clamping a sample carriage to a bridge support.

25 Claims, 4 Drawing Sheets

SAMPLE CARRIAGE FOR SCANNING PROBE MICROSCOPE

FIELD OF THE INVENTION

The present invention relates to scanning devices delivering extremely stable, nanometer precise, two dimensional displacement of a scanning probe carriage across a target surface. More particularly, the invention relates to an apparatus for providing thermal and vibrational stability for a sample to be scanned.

BACKGROUND OF THE INVENTION

Scanning probe microscopes (SPMs) are instruments that provide high resolution information about surface contours. Vertical movement of a sensing probe, in response to a raster scanning procedure of the sensing probe across a target surface, is used for determining the target surface contour. Examples of SPM devices include implementations based on the interaction of attractive forces including atomic, electrical or magnetic to maintain a constant probe to target surface gap, or distance. One common use of these devices is imaging. Some types of SPMs have the capability of imaging individual atoms.

In addition to imaging surface contours, SPMs can be used to measure a variety of physical or chemical properties with detail over the range from a few Angstroms to hundreds of microns. For these applications, SPMs can provide lateral and vertical resolution that is not obtainable from any other type of device. Examples of applications include imaging or measuring the contour properties of transistors, silicon chips, disk surface, crystals, cells, or the like.

In order to provide for high resolution information about surface contours, variables for the SPM include the effective size of the scanning probe, the positioning of the scanning probe above the target surface, and the precision of the scanning device itself. A precise scanning probe measurement can take tens of minutes to complete. During the measurement period, any movement of the sample relative to the probe degrades the accuracy of the data, for which compensation or correction may not be available. The resulting measurement is therefore less precise than a measurement taken without relative movement. The major components of the relative movement between the sample and the probe are mechanical vibration of the scanning probe microscope body itself and thermal creep of the scanning probe microscope components within a thermal path between the scanning probe assembly and the sample.

Mechanical vibration is a practical consequence effecting the accuracy of any precise measurement. As the relative magnitude of a measurement approaches the nanometer to Angstrom range, as in scanning probe microscopes, the component effect of vibration increases as an absolute magnitude of the overall measurement.

Thermal creep is also present in precise measuring devices. In this context, thermal creep refers to the relative motion of the sample versus the probe tip caused by a change in temperature of the scanning probe microscope components in the thermal path between the scanning probe assembly and sample. As a time dependent function, thermal creep need not be linear nor monotonic, and accordingly compensation or correction may not be fully afforded. Thermal creep is a function of many parameters including total path length of structural materials that hold the sample in position, thermal expansion coefficients of these materials, magnitude and application of thermal gradients, and thermal mass of materials.

The elements of mechanical vibration and thermal creep both vertically and horizontally affect scanning probe positioning relative to the sample. In standard scanning probe applications of small target areas, the resolution in the vertical axis is an order of magnitude greater than the resolution in the horizontal axis. Thus, vertical compensation for mechanical vibration and thermal creep is, at a minimum, required in standard applications.

Large samples require supporting structures large enough to provide a range of motion great enough to scan the entire sample surface. With increasing dimensions of supporting structures, the effect of horizontal vibration is more significant. Thus, as the target area of the surface to be sampled approaches that of production size samples, the need for horizontal compensation of mechanical vibration and thermal creep increases. The need to provide horizontal compensation of mechanical vibration and thermal creep is particularly important where the objective of a scanning probe system is to make precision horizontal measurements. This is particularly important in critical dimension (CD) metrology.

The need to improve accuracy of data in sensitive apparatus, such as scanning probe microscopes or scanning tunneling microscopes, has been addressed by vibration damping or isolation. U.S. Pat. No. 4,908,519 to Park et al an U.S. Patent to Bednorz et al illustrate, for example, spring mass damper vibration isolation systems. A shortcoming of these systems are that only small samples may be scanned and the systems offer no compensation for thermal creep. U.S. Pat. No. 4,947,042 to Nishioka illustrates a flux channeling bar magnet to pull a scanning head onto a sample mount. Although rigidity of the structure is enhanced, the embodiment does not address thermal creep.

In view of the fact that the resolution of the new microscope developments and the requirements in electronic circuit manufacturing have increased over several orders of magnitude, it has become necessary to design new sample holding device which avoid the disadvantages of the prior art.

SUMMARY OF THE INVENTION

It is therefore an object of the present invention to provide a sample carriage providing vibrational and thermal stability.

The present invention provides an apparatus for positioning a sample on a sample carriage within a scanning probe microscope. A bridge plate provides a surface for receiving a scanning probe assembly. A positioning plate, disposed on a carriage base plate, provides a surface for placing a sample to be scanned. The invention further provides a means for releasably clamping the carriage base plate to the bridge plate.

DETAILED DESCRIPTION OF THE INVENTION

Figure 1:
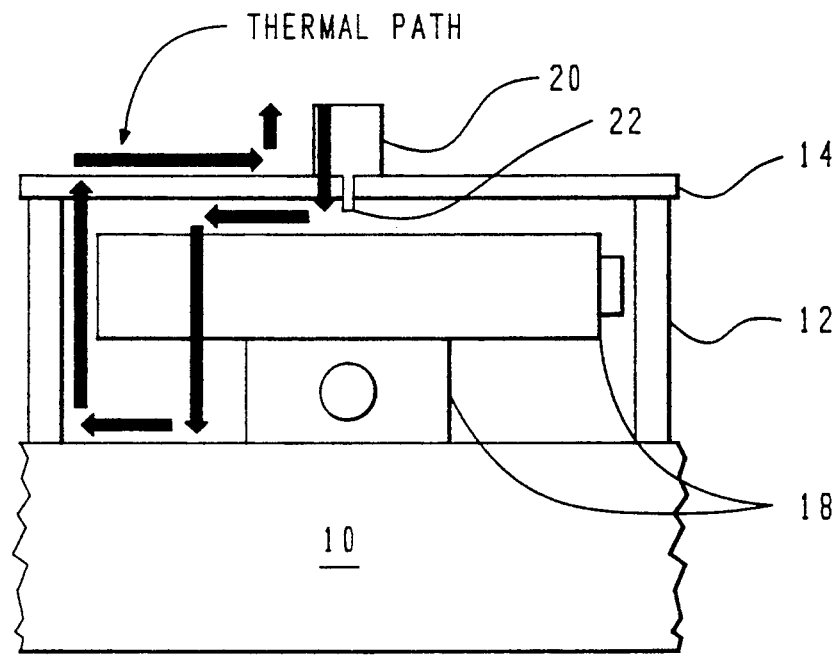
FIG. 1 illustrates a prior art embodiment of a scanning probe microscope body.

The assembly of FIG. 1 is used in a prior art scanning probe microscope. It includes a base plate 10 which provides a reference surface with respect to which two or more bridge support stansions 12 are mounted. The plurality of bridge support stansions 12, in turn, provide a reference to which a bridge plate 14 is mounted. A scanning probe assembly 20 is affixed atop the bridge plate 14 and above a sample (not shown). The scanning probe assembly 20 carries a probe tip 22 at its lower end which, in the preferred embodiment of the invention, is positioned above the sample at a desired tip to target surface gap. The desired tip to target surface gap will depend on the nature of the scanning probe system, and will generally be defined at a distance where attractive forces between the probe tip 22 and the sample interact. Interactive forces in scanning probe devices include atomic, electrical potential, magnetic, capacitive, or chemical potential to maintain a constant probe to target surface gap. Alternate embodiments include ones in which the scanning probe makes contact with the sample or target surface. In either embodiment however, relative movement between the sample and the probe include mechanical vibration of the scanning probe microscope body itself and thermal creep of the scanning probe microscope components within a thermal path between the scanning probe assembly and the sample.

Referring again to FIG. 1, the sample rests on a large sample coarse positioner 18 in such a manner so that the sample is positionable in relation to the probe tip 22. Moreover, inasmuch as the sample base plate 30 is not clamped, or otherwise fixed, to the coarse positioner 18, the sample rests rather loosely on the coarse positioner 18. Further, the sample coarse positioner 18 is affixed to the same base plate 10 as the bridge support stansions 12. Any mechanical vibration of the scanning probe microscope body itself, is therefore translated independently to the sample through the sample coarse positioner 18, and to the probe tip 22 through the bridge support stansions 12, bridge plate 14, and scanning probe assembly 20. The independent translation of the mechanical vibration results, therefore, in a relative movement between the probe tip 22 and sample.

Still referring to FIG. 1, the thermal path for the prior art scanning probe system starts at the sample, through the sample coarse positioner 18, to the base plate 10, up the bridge support stansions 12, through the scanning probe assembly 20, and finally to the probe tip 22. This is indicated by the solid arrows in FIG. 1. Inasmuch as total path length is a variable in thermal creep, the long thermal path as illustrated in FIG. 1 is one in which the potential for scanning probe measurement inaccuracies due to thermal creep is significant.

Figure 2:
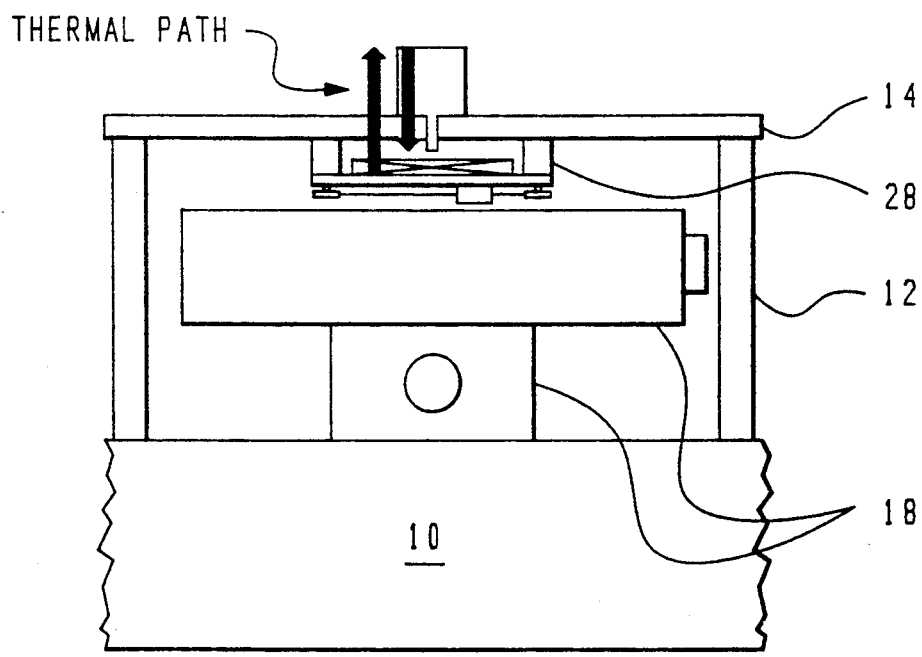
FIG. 2 illustrates an embodiment of the scanning probe microscope employing a physically decoupled sample carriage of the present invention.

FIG. 2 illustrates a large sample scanning probe system with a physically decoupled sample carriage 28 in a thermal and vibrational stability configuration. In the thermal and vibrational stability configuration, the sample carriage 28 is releasably clamped to, and suspended below, the bridge plate 14 in a manner herein described in the preferred embodiment of the invention. While not in the thermal and vibrational stability configuration, the sample carriage 28 and sample rest on the large sample coarse positioner 18 in such a manner so that the sample is positionable in relation to the probe tip 22.

As in the prior art, the scanning probe system as illustrated in FIG. 2, includes a base plate 10 which provides a reference surface with respect to which two or more bridge support stansions 12 are mounted. The plurality of bridge support stansions 12, in turn, provide a reference to which a bridge plate 14 is mounted. A scanning probe assembly 20 is affixed atop the bridge plate 14 and above a sample. The scanning probe assembly 20 carries a probe tip 22 at its lower end, which is positioned above the sample at a desired tip to target surface gap.

Referring again to FIG. 2, the sample rests on the sample carriage 28 and is shown in a thermal and vibrational stability configuration. While in this configuration, in contrast to the prior art, the sample carriage 28 is isolated from the major body, comprising the base plate 10, coarse positioner 18, and bridge support stansions 12, of the scanning probe microscope. That is, inasmuch as the freely supported size of the major body of the scanning probe microscope is significantly greater than that of the sample carriage 28, by physically decoupling the sample carriage 28 from direct support upon the coarse positioner 18 (and the major body of the scanning probe microscope), the sample is less susceptible to the low frequency and high amplitude modes of vibration associated with the body of the scanning probe microscope, and the base plate 10.

Still referring to FIG. 2, by physically decoupling the sample carriage 28, most of the thermal path length of the prior art embodiment (as illustrated in FIG. 1) is eliminated. The short thermal path for the large sample scanning probe system with the physically decoupled sample carriage system starts at the sample, through the sample carriage 28, the scanning probe assembly 20, and to the probe tip 22. This is indicated by the solid arrows in FIG. 2. As in the prior art, inasmuch as total path length is a variable effecting thermal creep, the configuration as illustrated in FIG. 2 is one in which the potential for scanning probe measurement inaccuracies due to thermal creep are greatly reduced. Remaining elements in the shortened thermal path length can be fabricated from a low coefficient of expansion material.

In addition to providing vertical stability, the configuration of FIG. 2 provides added horizontal stability. The reduced thermal path length, as illustrated in FIG. 2, not only reduces the relative potential for vertical thermal expansion, but also reduces the relative potential for horizontal thermal expansion. Moreover, by physically decoupling the sample carriage 28 from the coarse positioner 18, the configuration reduces the potential for both vertical and horizontal measurement inaccuracies due to mechanical vibrations.

Figure 3A:
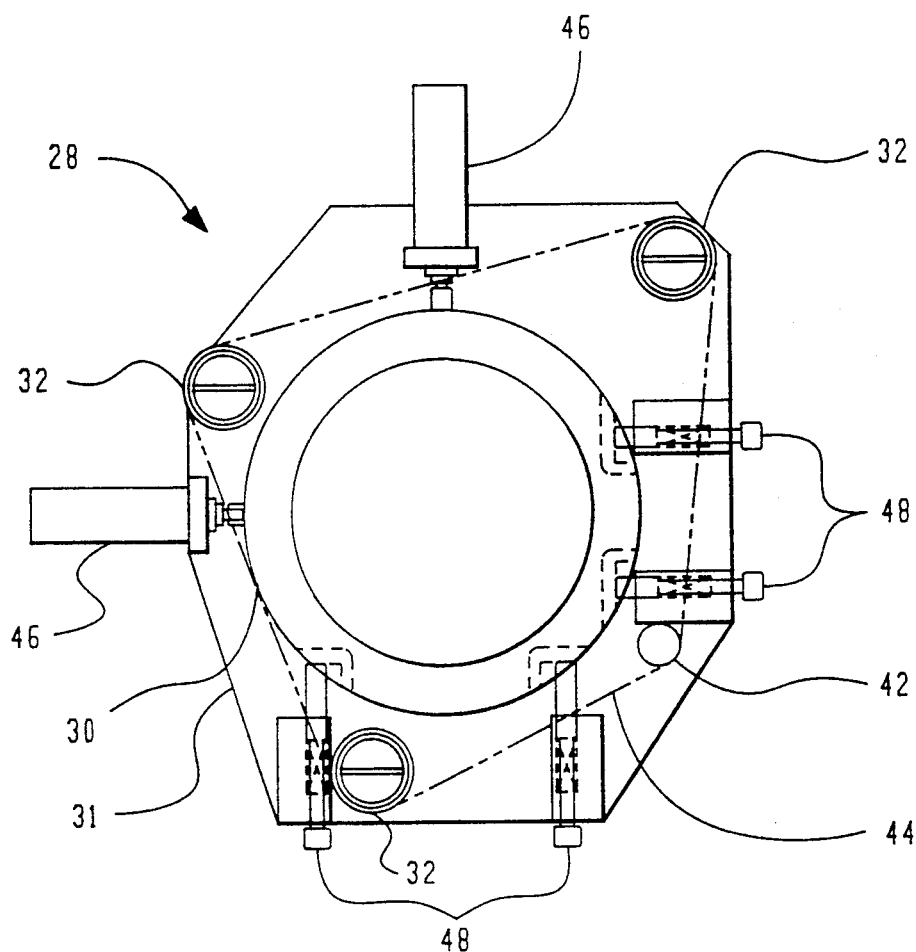
FIG. 3A illustrates a top view of the sample carriage.

FIG. 3A illustrates a top view of the preferred embodiment of the sample carriage 28. It includes a positioning plate 30 upon which a sample (not shown) is placed. The positioning plate 30 is slidably disposed on a carriage base plate 31, which in turn may be disposed on the coarse positioner 18 (FIG. 2). A plurality of magnetic clamp assemblies 32 are adapted about the periphery of the carriage base plate 31 and provide a means for releasably clamping the sample carriage 28 to the bridge plate 14 (FIG. 2). Although, in the preferred embodiment, three magnetic clamp assemblies 32 are used as a means for releasably clamping, alternate embodiments may vary in the number of clamp assemblies as well as the nature of the clamping means. That is, alternate clamping means may comprise vacuum or the like. A magnet actuation motor 42 is adapted to the carriage base plate 31, and along with a belt 44, provide a means for actuating each magnetic clamp assembly 32.

Still referring to FIG. 3A, once the sample carriage has been physically decoupled from the major body of the scanning probe microscope, two fine positioning motors 46 serve to further position a sample on the sample carriage 28. The fine positioning motors 46 are each biased by at least one counter pressure spring 48.

Figure 3B:
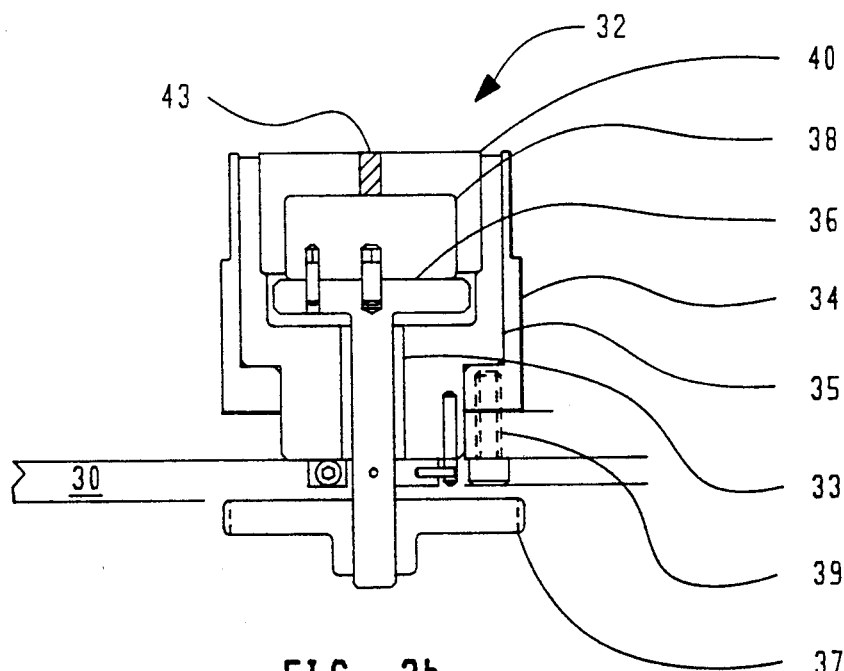
FIG. 3B illustrates a cross sectional view of the magnetic clamp assembly.

Referring next to FIG. 3B, each magnetic clamp assembly 32 comprises a cylindrical sleeve 34, having an axially disposed bore. In the preferred embodiment, the cylindrical sleeve 34 is made from annealed super invar which has a thermal coefficient of expansion better than two orders of magnitude below that of steel. An actuator 36, having a circular base and a shaft extending vertically downward, is disposed within the cylindrical sleeve 34. A permanent magnet 38 is disposed above the actuator 36, within the magnetic clamp assembly 32. The permanent magnet 38 is secured to the actuator 36 base by a pin, dowel, epoxy, or other known means for securing the like.

A magnetic shunt 40 is fixed within the magnetic clamp assembly 32, above the permanent magnet 38. The magnetic shunt 40 consists of opposing pole pieces 42 joined by a joint member 43 formed of a non-magnetic material. Further, the top of the magnetic shunt 40 is disposed within the magnetic clamp assembly 32 such that the top of the magnetic shunt 40 is slightly below the top of the cylindrical sleeve 34.

A flux blocking shield 35 is interposed between the cylindrical sleeve 34 and the permanent magnet 38. The cylindrical sleeve 34 is made from a material having a low thermal coefficient. However, the material is also one which is magnetically conductive. As such, without the flux blocking shield 35, the magnetic flux in the magnetic clamp 32 in the actuated state would conduct through the cylindrical sleeve 34, instead of being forced over the magnetic shunt 40, and would therefore not clamp. A bushing 33 may optionally be interposed between the flux blocking shield 35 and actuator 36/permanent magnet 38 combination in order to serve as a guide for the actuator 36, permanent magnet 38 combination within the magnetic clamp assembly 32.

The magnetic clamp assembly 32 is secured to the carriage base plate 31 by a pin, dowel, epoxy, or similar means for securing. In the preferred embodiment, as shown in FIG. 3B, a screw 39 is used to secure the cylindrical sleeve 34 to the carriage base plate 31. The actuator 36 shaft in the magnetic clamp assembly 32 extends through an aperture in the carriage base plate 31 is fastened to the carriage base plate 31 by a gear 37 or similar means for rotatably engaging the actuator 36/permanent magnet 38 combination within the magnetic clamp assembly 32. Each gear 37 is mechanically connected to the belt 44 (FIG. 3A) and magnet actuating motor 42 (FIG. 3A), the combination providing a means for rotatably engaging each clamp assembly 32 for releasably clamping the sample carriage 28 in its thermal and vibrational stability configuration.

Referring again to FIG. 2, a z axis is defined as the longitudinal axis running through the scanning probe 20 and probe tip 22. Further, the sample carriage 28 carrying a sample to be scanned is initially positioned by moving the coarse positioner 18, in an x y plane, to a location where the scanning probe 22 is above the area to be scanned. The x y plane thus being defined as a plane perpendicular to the z axis. In the preferred embodiment, an air actuator (not shown), interposed between the sample carriage 28 and positioner 18, is inflated in order to physically decouple the sample carriage 28 from the positioner 18 and to bias the sample carriage 28 against the bottom of the bridge plate 14 (FIG. 2). The air actuator serves to decouple the sample carriage 28 from the positioner 18 and move the sample carriage 28 in a vertical (z) direction, without changing the (x,y) position of the sample relative to the probe tip 22. The sample carriage 28 is then releasably coupled to the bridge plate 14 by engaging the magnet actuation motor 42, belt 44, and gear 37 at the lower end of the clamp assembly 32. Finally, the air actuator is deflated in order to completely decouple the sample carriage 28 from the major body of the scanning probe microscope.

The carriage assembly 28 is thus physically decoupled from the coarse positioner 18 (and hence from the major body of the scanning probe microscope) and releasably clamped to the bridge plate 14 by engaging the magnetic clamp assemblies 32. In so doing, the scanning probe microscope is configured in the thermal and vibrational stability configuration. Next, in the preferred embodiment, the positioning motor 46 and counter pressure spring 48 combination serve to further position the sample in a fine positioning step. That is, once decoupled from the major body of the scanning probe microscope and releasably coupled to the bridge plate 14, the sample is further positioned by reciprocal forces between a corresponding positioning motor 46 and a counter pressure spring 48. By applying a signal to the positioning motor 46, thereby urging the carriage base plate 30 toward or away from the counter pressure spring 48, the carriage base plate 30 is further adjusted in an fine positioning step. Having completed both coarse and fine positioning the scanning probe microscope is available for a scanning procedure or technique as offered by the scanning probe assembly 20.

The sample carriage 28, carrying the sample, is subsequently repositioned by first recoupling the sample carriage 28 to the coarse positioner 18, by reinflating the air actuator (not shown) and disengaging the magnetic clamps 32. Once recoupled, the sample carriage 28 (and thus the sample to be scanned) is free to be repositioned by the coarse positioner 18, to a subsequent location to be scanned. Upon repositioning, the sample carriage 28 is again decoupled from the coarse positioner 18 and configured in the thermal and vibrational stability configuration.

Figure 4:
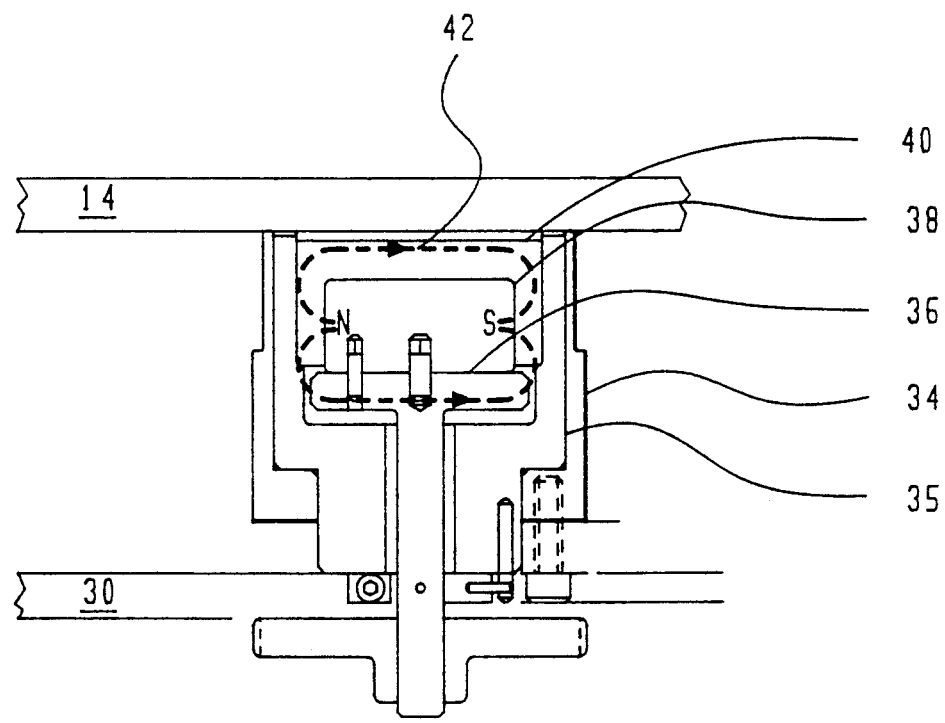
FIG. 4 illustrates the magnetic clamp assembly in its non engaged mode.

As illustrated in FIG. 4, in a non engaged mode, the actuator 36/permanent magnet 38 combination is rotated so that the opposing poles (North and South) of the permanent magnet are substantially parallel to the non-magnetic joint 43 of the magnetic shunt 40. In this position, the path of the magnetic flux is as illustrated. The nature of the magnetic pole elements 42 are such that they serve to pass or conduct the flow of the magnetic flux path. The magnetic flux path passes through the magnetic materials, as shown, and results in a leakage field at the clamp face of 120 gauss in the illustrated embodiment.

Figure 5:
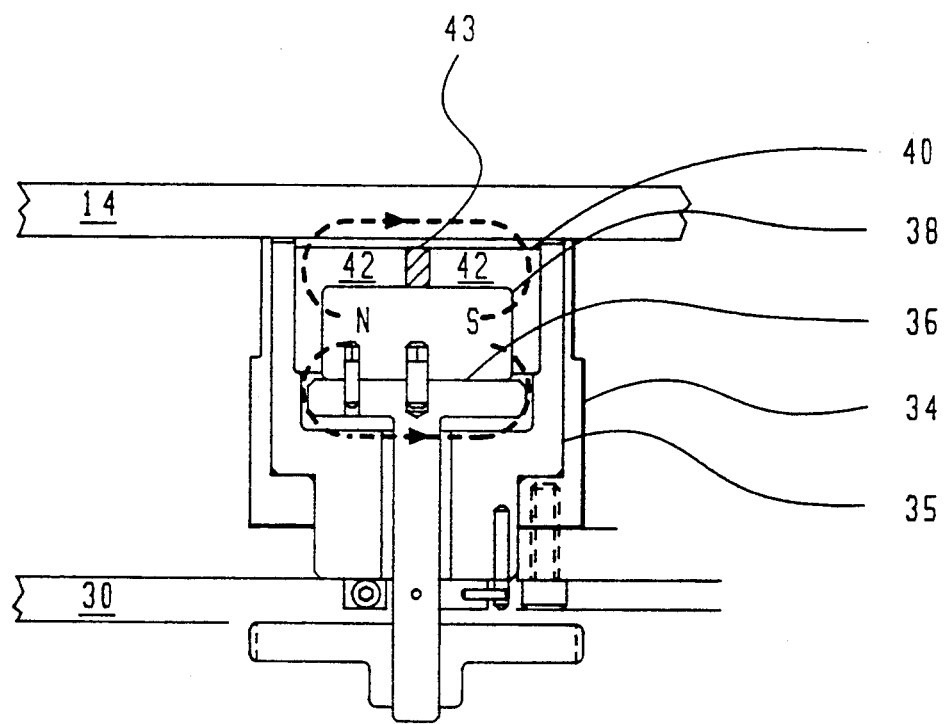
FIG. 5 illustrates the magnetic clamp assembly in its engaged mode.

As illustrated in FIG. 5, in an engaged mode, the actuator 36/permanent magnet 38 combination is rotated so that the opposing poles (North and South) of the permanent magnet 38 lie on either side of the non-magnetic joint 43 of the magnetic shunt 40. In this position, the path of the magnetic flux is as illustrated. The nature of the non-magnetic joint element 43 is such that it serves to impede or block the magnetic flux path. The magnetic flux path passes through the magnetic materials, as shown, and results in a peak leakage field at the clamp face of 2.5 kilogauss in the illustrated embodiment.

Further, while engaged, the cylindrical sleeve 34 bears against the carriage base plate 30 and bridge plate 14. That is, with the top of the magnetic shunt 40 disposed slightly below the top of the cylindrical sleeve 34, the magnetic shunt is prohibited from physically coming in contact with the bridge plate 14. However, while in the engaged mode, the magnetic flux path to and from the permanent magnet 38 pass through the magnetic shunt 40. Thus, the magnetic shunt 40 is magnetically coupled (along with permanent magnet 38) to the bridge plate 14, without physically contacting the bridge plate 14. In so doing, only the cylindrical sleeve 34 is the only element of the magnetic clamp assembly 32 within the thermal path of the reconfigured system.

While the invention has been described above in connection with a preferred embodiment therefore as illustrated by the drawings, those of skill in the art will readily recognize alternative embodiments of the invention can be easily produced which do not depart from the spirit and scope of the invention as defined in the following claims.

We claim:

1. A sample carriage for a scanning probe microscope comprising:
   a bridge plate for receiving a scanning probe assembly;
   a carriage base plate;
   a positioning plate, disposed on said carriage base plate, for holding a sample; and
   means for releasably clamping said carriage base plate to said bridge plate.

2. The sample carriage as in claim 1, wherein said clamping means is magnetic.

3. The sample carriage as in claim 2, wherein the sum of the masses of said base and said coarse positioner are larger than the mass of said sample carriage.

4. The sample carriage as in claim 2, wherein each clamping means comprises:
   a cylindrical sleeve having a bore disposed axially therethrough, wherein the top of said cylindrical sleeve bears against the bottom of said bridge plate and the bottom of said cylindrical sleeve bears against the top of said carriage base plate while said sample carriage is positioned in a thermal and vibrational stability configuration;
   an actuator having a circular base and a shaft extending below said circular base, said actuator being rotatably disposed within said cylindrical sleeve, wherein the shaft of said actuator extends beyond the bottom of said cylindrical sleeve and through an aperture in said carriage base plate;
   a flux blocking shield interposed between said cylindrical sleeve and said actuator;
   a permanent magnet disposed above the base of said actuator;
   means for securing said permanent magnet to said actuator;
   a cylindrical magnetic shunt disposed above said permanent magnet, wherein the top of said cylindrical magnetic shunt is disposed below the top of said cylindrical sleeve.

5. The sample carriage as in claim 4, wherein:
   said cylindrical sleeve comprises a material having a low thermal coefficient.

6. The sample carriage as in claim 4, wherein:
   said magnetic shunt comprises opposing pole pieces joined together by a joint member formed of a non-magnetic material.

7. The sample carriage as in claim 4, further comprising:
   a bushing disposed within said cylindrical sleeve, wherein the outer surface of said bushing is in contact with the said flux blocking shield and the inner surface of said bushing is in contact with said actuator.

8. The sample carriage as in claim 7, further comprising:
   a first means for securing said cylindrical sleeve to said carriage base plate; and
   a second means for rotatably securing said actuator to said carriage base plate, wherein said actuator and permanent magnet are free to rotate about an axis defined by the shaft of said actuator.

9. The sample carriage as in claim 8, wherein:
   said first securing means comprises a screw, and
   said second securing means comprises a gear for receiving the shaft of said actuator and a pin, wherein said securing means is disposed on the bottom of said carriage base plate.

10. The sample carriage as in claim 9 further comprising:
    means for actuating said magnetic clamp assembly.

11. The sample carriage as in claim 1, further comprising:
    means for fine positioning said positioning plate in relation to said carriage base plate.

12. A sample carriage for a scanning probe microscope comprising:
    a bridge plate for receiving a scanning probe assembly;
    a carriage base plate;
    a positioning plate, disposed on said carriage base plate, for holding a sample;
    means for coarse positioning said sample carriage in an x y plane;
    means for moving said sample carriage in a z direction; and
    means for releasably clamping said carriage base plate to said bridge plate.

13. The sample carriage as in claim 12, wherein said clamping means is magnetic.

14. The sample carriage as in claim 13, wherein the sum of the masses of said base and said coarse positioner are larger than the mass of said sample carriage.

15. The apparatus as in claim 13, wherein each clamping means comprises:
    a cylindrical sleeve having a bore disposed axially therethrough, wherein the top of said cylindrical sleeve bears against the bottom of said bridge plate and the bottom of said cylindrical sleeve bears against the top of said carriage base plate while said sample carriage is positioned in a thermal and vibrational stability configuration;
    an actuator having a circular base and a shaft extending below said circular base, said actuator rotatably disposed within said cylindrical sleeve, wherein the shaft of said actuator extends beyond the bottom of said cylindrical sleeve and through an aperture in said carriage base plate;

a flux blocking shield interposed between said cylindrical sleeve and said actuator;

a permanent magnet disposed above the base of said actuator;

means for securing said permanent magnet to said actuator; and a cylindrical magnetic shunt disposed above said permanent magnet, wherein the top of said cylindrical magnetic shunt is disposed below the top of said cylindrical sleeve.

16. The sample carriage as in claim 15, wherein:

said cylindrical sleeve comprises a material having a low thermal coefficient.

17. The sample carriage as in claim 15, wherein:

said magnetic shunt comprises opposing pole pieces joined together by a joint member formed of a non-magnetic material.

18. The sample carriage as in claim 15, further comprising:

a bushing disposed within said cylindrical sleeve, wherein the outer surface of said bushing as in contact with the said flux blocking shield and the inner surface of said bushing is in contact with said actuator.

19. The sample carriage as in claim 17, further comprising:

a first means for securing said cylindrical sleeve to said carriage base plate; and a second means for rotatably securing said actuator to said carriage base plate, wherein said actuator and permanent magnet are free to rotate about an axis defined by the shaft of said actuator.

20. The sample carriage as in claim 19, wherein:

said first securing means comprises a screw, and said second securing means comprises a gear for receiving the shaft of said actuator and a pin, wherein said securing means is disposed on the bottom of said carriage base plate.

21. The sample carriage as in claim 20 further comprising:

means for actuating said magnetic clamp assembly.

22. The sample carriage as in claim 12, further comprising:

means for fine positioning said positioning plate in relation to said carriage base plate.

23. A sample carriage for a scanning probe microscope comprising:

a bridge plate for receiving a scanning probe assembly;

a carriage base plate;

a positioning plate, disposed on said carriage base plate, for holding a sample;

means for coarse positioning said sample carriage in an x y plane;

means for releasably clamping said positioning plate to said bridge plate, wherein a long thermal path comprises a combination of said bridge plate, said clamping means, said positioning plate, said carriage base plate, and said coarse positioning means while said sample carriage is physically coupled with said coarse positioning means; and wherein a short thermal path comprises a combination of said bridge plate, said clamping means, said positioning plate, and said sample carriage is physically decoupled from said coarse positioning means.

24. A process for configuring a scanning probe microscope in an initial thermal and vibrational stability configuration comprising the steps of:

coarse positioning a sample carriage, disposed on a large sample coarse positioner, below a scanning probe, disposed on a bridge support, at a location to be scanned;

moving said sample carriage away from said coarse positioner; and releasably clamping said sample carriage to said bridge support.

25. A process for configuring a scanning probe microscope in subsequent thermal and vibrational stability configurations comprising the steps of:

coarse positioning a sample carriage, disposed on a large sample coarse positioner, below a scanning probe, disposed on a bridge support, at a location to be scanned;

moving said sample carriage away from said coarse positioner;

releasably clamping said sample carriage to said bridge support;

fine positioning said sample carriage;

recoupling said sample carriage on said coarse positioner; and coarse repositioning said sample carriage, disposed on said coarse positioner, below said scanning probe at a subsequent location to be scanned.

* * * * *